United States Patent
Daun-Lindberg et al.

(10) Patent No.: US 6,211,726 B1
(45) Date of Patent: Apr. 3, 2001

(54) LOW VOLTAGE, HIGH-CURRENT ELECTRONIC LOAD

(75) Inventors: Timothy Charles Daun-Lindberg; Michael Lee Miller, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/345,607

(22) Filed: Jun. 28, 1999

(51) Int. Cl.$^7$ .................................. G11C 7/00; H03D 1/00
(52) U.S. Cl. .............................. 327/536; 327/56; 327/77; 327/50
(58) Field of Search .................................. 327/536, 437, 327/530, 541, 546, 306, 81, 67, 54, 77

(56) References Cited

U.S. PATENT DOCUMENTS 5,881,014 * 3/1999 Ooishi .................................. 327/536

\* cited by examiner

*Primary Examiner*—Dinh T. Le
(74) *Attorney, Agent, or Firm*—Felsman, Bradley, Vaden, Gunter & Dillon

(57) ABSTRACT

An electronic load circuit provides a variable load current at a high amp level, at low-voltage so that contemporary voltage supplies of perhaps 1.5V may be tested. This load is used for testing voltage supply circuits for computer systems or the like. A number of parallel, high-current MOS transistors of low internal resistance are used as a constant-current load. Current in the load path is sensed by a sensing resistor connected in series with all of the transistors, and this resistor has a value of the order of the effective internal resistance of the source-to-drain paths of the parallel transistors and connecting links to these transistors via a circuit board, connector terminals, etc. The sensing resistor provides a feedback signal to a high-gain op-amp, the output of which is compared to a variable input signal to produce a gate drive voltage for the transistors. The input signal may be varied to simulate the variable loading exhibited by a computer system. It is important that the current sensing arrangement including the sensing resistor is of low resistance.

12 Claims, 2 Drawing Sheets

LOW VOLTAGE, HIGH-CURRENT ELECTRONIC LOAD

BACKGROUND OF THE INVENTION

1. Technical Field

This invention relates to electronic load circuits, and more particularly to a low-voltage, high-current load circuits for use in testing power supplies or the like for computers and systems of this type.

2. Description of the Related Art

In the design and production of power supply modules for computer systems and the like, it is necessary to have load circuits which simulate the operation of the computer itself in the way the voltage and current levels presented by the load vary with time and other conditions. For example, the load presented to the power supply by the computer system may switch between high-current and low-current when the computer goes into a power-down or sleep mode as power management mechanisms go into effect. Or, current spikes may occur when starting up equipment such as a hard drive, or at boot-up when large capacitive loads are being charged. Likewise, power-up self test creates a widely variable load as all of the peripheral equipment is exercised.

Previous load circuits used for test purposes in the manufacture of computer systems or the like have not been able to operate at low voltages such as the supply voltage levels being specified for contemporary microprocessor chips and memory chips. For example, supply voltage levels of 3.3V have ben used for some time, and levels of 1.7v or 1.5V are coming into common usage. At these low voltage levels, and at high currents of sometimes hundreds of amps, the available equipment is not able to accurately simulate varying load currents, nor represent the loading exhibited by a computer system.

SUMMARY OF THE INVENTION

It is therefore one object of the present invention to provide an improved electronic load of the type used for testing regulated power supplies.

It is another object of the present invention to provide an improved low-voltage, high-current electronic load circuit.

It is yet another object of the present invention to provide an improved low-voltage, high-current electronic load circuit which simulates the operations of a computer system under varying load conditions.

The above as well as additional objects, features, and advantages of the present invention will become apparent in the following detailed written description.

According to one embodiment of the invention, an electronic load circuit provides a variable load current at a high amp level, at low-voltage so that contemporary voltage supplies of perhaps 1.5V may be tested. This load is used for testing voltage supply circuits for computer systems or the like. A number of parallel, high-current MOS transistors of low internal resistance are used as a constant-current load. Current in the load path is sensed by a resistor connected in series with all of the transistors, and this resistor is of the order of the effective internal resistance of the source-to-drain paths of the parallel transistors and connecting links to these transistors via a circuit board, connector terminals, etc. The sensed voltage across this resistor provides a feedback signal to a high-gain op-amp, the output of which is compared to a variable input signal to produce a gate drive voltage for the transistors. The input signal may be varied to simulate the variable loading exhibited by a computer system. It is important that the current sensing arrangement including the sensing resistor is of low resistance.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment, when read in conjunction with the accompanying drawings, wherein:

DETAILED DESCRIPTION OF PREFERRED EMBODIMENT

Figure 1:
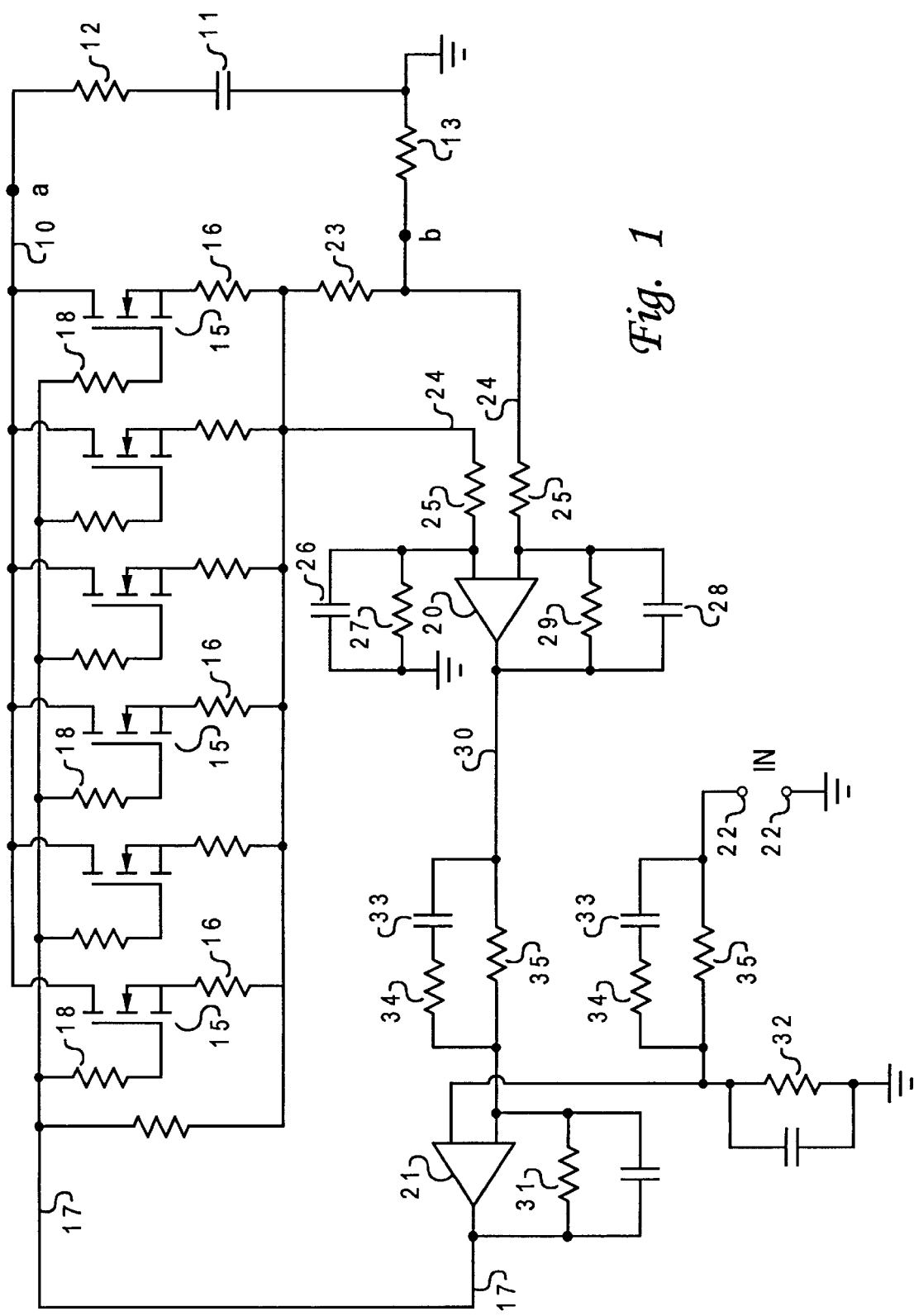
FIG. 1 is an electrical schematic diagram of a load circuit which may use features of the present invention.

Referring to FIG. 1, a load circuit is shown in which concepts of the invention may be used. The output (input) 10 of this circuit is across a pair of terminals a and b, i.e., between terminal a and ground or reference potential. The voltage source for which the load circuit is used as a test load is represented by a voltage source 11 and small resistances 12 and 13 which are the internal resistances of the voltage source and the paths between a and b, including the connectors and circuit board, etc. In an example, this voltage source 11 is 1.7V and the internal series resistances 12 and 13 are each about 250 micro-ohm. These values are merely for illustrative purposes; the voltage source may be in the range of about 3.3V down to perhaps 1.0V, although the point is that the voltage source for which the circuit is useful is generally low, in the range used in contemporary computer chips and memory chips. The test load circuitry comprises in this example six N-channel FETs 15, all having source-to-drain paths connected in parallel with one another and across the terminals a and b. In series with the source-to-drain paths of each one of these transistors 15 is shown a series resistor 16 which is merely illustrative of the internal resistance of the path, i.e., a separate resistor 16 is not connected into the circuit, but instead it is recognized that the circuit board paths, connectors, solder joints, etc., as well as the source-to-drain paths of the parallel transistors, all have some very small but finite resistance. This resistance 16 is perhaps about 0.1 milli-ohm, very small, so that the parallel transistors 15 would present a very small resistance across the terminals a and b if the transistors were turned on fully by a voltage across their gates of much greater than the threshold voltage Vg of the transistors. However, in order to operate the load circuit as essentially a constant current device, the voltages on the gates, applied by a line 17 through series resistors 18 (each about 10-ohm) is kept in a range which causes the transistors 15 to operate in their linear region. The transistors 15 are of the type sold as high current, low internal resistance, "power" transistors, capable of each conducting many amps of source-to-drain current, so the capability of the load circuit of FIG. 1 is perhaps 100- or 150-amps or more. Several of the circuits of FIG. 1 may be connected in parallel to test a power supply, so currents of many hundreds of amps may be accommodated.

The value of the load current in the load circuit of FIG. 1 is variable, and is controlled by a feedback arrangement including two op-amps 20 and 21 and an input value at input terminals 22. The input for the op-amp 20 is responsive to voltage across the very-small, sensing resistor 23 (e.g., 1-milliohm), via lines 24 and series 1K resistors 25. Thus, the input to op-amp 20 is proportional to load current, with the object being to maintain the load current at some selected value. The op-amp is a high-gain, off-the-shelf component, chosen for wide bandwidth and low offset voltage. Poles and zeros are selected by RC circuits 26, 27 at one input and 28, 29 as a feedback loop, to set the response band and to avoid oscillations, providing a stable circuit; for example, these RC circuits may use 1-picofarad capacitors 26, 27 and 66.5-Kohm resistors 27, 29. The output 30 of the op-amp 20 is a voltage level proportional to load current flowing through the source-to-drain paths of the multiple transistors 15.

The second op-amp 21 compares the voltage at output 30 of op-amp 20 with a user-selected input voltage level at input 22, and produces a control voltage level on line 17 for driving the transistors 15. This control voltage will be at whatever level is needed to produce the selected load current, and is higher for higher load current. The op-amp 21, like the op-amp 20, is standard device, chosen for wide bandwidth and low offset voltage, such as commercially available as part number MC33274_MC. The poles and zeros for the op-amp 21 are set by two identical pairs of RC circuits. At input and feedback, RC circuits 31 and 32 use 1-megohm resistors and 2.7-nanofarad capacitors. The other pair at the inputs use 820-picofarad capacitors 33 with series 50-ohm resistors 34 and parallel 2.3-kohm resistors 35; these are merely examples of the type of RC circuits selected.

Figure 2A:
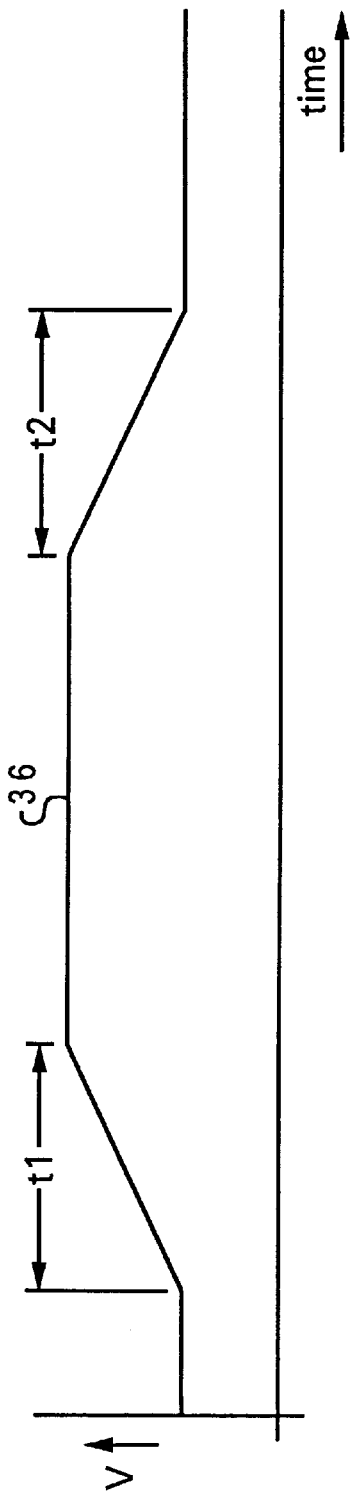
FIGS. 2a, and 2b, are a diagrams of voltage vs. time for voltages occurring in the load circuit of FIG. 1.
Figure 2B:
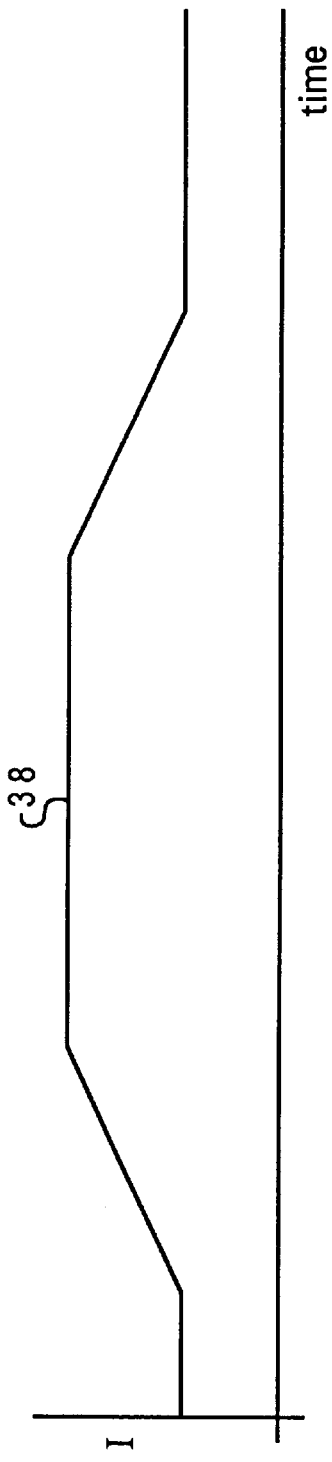

The input 22 may be a constant value, e.g., +6V, as selected by the user by potentiometer. A higher voltage produces a higher load current and lower produces lower current. Or, the input 22 may be a function generator such as a pulse generator for which the rise and fall times of the pulses may be varied. This type of signal represents the variable loading exhibited by a computer system as it cycles between full power and "suspend" or sleep modes where power-saving mechanisms turn off various components, change the clock rate, etc. Also, when going through power-on self-test, a computer system will exhibit varying current usage. Referring to FIG. 2a, a line 36 represents an input voltage at input 22 produced by a function generator, and the initial and final voltage values as well as the rise and fall times t1 and t2 may be selected by the user to simulate varying current demands of a computer system. In FIG. 2b, the load current (voltage across resistor 23) is represented by a line 38, and it is seen that the load current tracks the input voltage. The gate drive voltage on the line 17, however, will be whatever voltage is needed such that the load current tracks the input voltage; this voltage my be from about the threshold voltage of the transistors 15 up to near the supply voltage used for the op-amp 21. If the selected load current was 80-amps, for example, the input voltage at input 22 might be 6V (depending on the gain of the feedback path), and the desired voltage across the resistor 23 is (80-amp)× (1-milliohm) or 0.08V. If the actual current was more that 80-amp, then the voltage on line 17 would go lower to lower the load current. The transistors 15 are running in their linear region, not fully on nor fully off.

It is important to note that the circuit of FIG. 1 is effective in operating as a low-voltage, high-current, electronic load for testing outputs of voltage regulators as may be used as power supplies for computer systems or the like. To accommodate the very low supply voltage output such as 1.7V, the current sensing mechanism used for feedback must be of very low impedance. In the embodiment described above, the sensing resistor 23 is not much more than about a value of the order of the internal resistance of the control devices (transistors 15) and the paths through the control devices.

While the invention has been shown and described with reference to a particular embodiment, it will be understood that various changes in form and detail of the preferred embodiment, as well as other embodiments of the invention, may be made by those skilled in the art without departing from the true spirit and scope of the invention.

What is claimed is:

1. A variable, high-current, low-voltage, load circuit for testing a voltage source, comprising:

a plurality of high-current transistors having source-to-drain paths connected in parallel between a pair of terminals and a test load, said transistors having gates separately connected to an input node by resistive means, each of said high-current transistors and connecting paths to said transistors having an internal resistance of a low value;

a sensing resistor connected in series with all of said source-to-drain paths having a resistance no greater than a value of about the order of said internal resistance of said high-current transistors and connecting paths, to thereby provide a feedback voltage responsive to current from the voltage source which passes through said test load;

a first high-gain op-amp responsive to said feedback voltage to produce an amplified feedback voltage related to said load current;

a second high-gain op-amp connected as a differential circuit comparing said amplified feedback voltage with a variable input voltage signal and producing a drive voltage to produce a current in said transistors related to the variable input voltage and responsive to said feedback voltage; and said drive voltage being connected to said input node.

2. A load circuit according to claim 1 wherein said voltage source has an internal resistance of less than the value of said sensing resistor.

3. A load circuit according to claim 2 wherein said value of said sensing resistor is of the order of a milliohm.

4. A load circuit according to claim 1 wherein said input voltage is varied with time under user control.

5. A load circuit according to claim 1 wherein an output voltage of said voltage supply connected to said pair of terminals is no more than about 2 volts.

6. A load circuit according to claim 5 wherein current in said load circuit exceeds about 100 amps.

7. A method of controlling a variable, high-current, low-voltage, load circuit used for testing voltage supply circuits or the like; said load circuit including a plurality of high-current transistors having source-to-drain paths connected in parallel between a pair of terminals and a test load; said transistors having gates separately connected to an input node; each of said high-current transistors having an internal resistance, including connecting paths, of a low resistance value; said method comprising the steps of:

generating a feedback voltage responsive to current from the voltage supply circuit through said test load across a sensing resistor connected in series with all of said source-to-drain paths, said sensing resistor having a resistance no greater than a value of about the order of said internal resistance of said high-current transistors and connecting paths;

producing an amplified feedback voltage related to said load current by a first high-gain op-amp responsive to said feedback voltage;

comparing said amplified feedback voltage with a variable input voltage signal and producing a drive voltage to produce a current in said transistors related to the variable input voltage and and responsive to said feedback voltage, by a second high-gain op-amp connected as a differential circuit;

applying said drive voltage to said input node.

8. A method according to claim 7 wherein said voltage source has an internal resistance of less than the value of said sensing resistor.

9. A method according to claim 8 wherein said value of said sensing resistor is of the order of a milliohm.

10. A method according to claim 8 wherein said input voltage is varied with time under user control.

11. A method according to claim 7 wherein an output voltage of said voltage supply applied to said pair of terminals is no more than about 2 volts.

12. A method according to claim 11 wherein current in said load circuit exceeds about 100 amps.

\* \* \* \* \*